United States Patent [19]

Polan et al.

[11] Patent Number: 4,549,950
[45] Date of Patent: Oct. 29, 1985

[54] SYSTEMS FOR PRODUCING ELECTROPLATED AND/OR TREATED METAL FOIL

[75] Inventors: Ned W. Polan, Madison; Raymond J. Smialek, Cheshire; Arvind Parthasarathi, Hamden, all of Conn.

[73] Assignee: Olin Corporation, New Haven, Conn.

[21] Appl. No.: 670,232

[22] Filed: Nov. 13, 1984

[51] Int. Cl.⁴ ............... C25D 17/00; C25D 21/06; C25D 21/18
[52] U.S. Cl. .................... 204/206; 204/216; 204/235; 204/276
[58] Field of Search ........... 204/216, 235, 275, 276, 204/152, 236, 206

[56] References Cited

U.S. PATENT DOCUMENTS

| | | | |
|---|---|---|---|
| Re. 30,180 | 12/1979 | Wolski et al. | 428/601 |
| 1,417,464 | 5/1922 | Edison | 204/13 |
| 1,425,184 | 8/1922 | Edison | 204/13 |
| 1,601,693 | 9/1926 | Merritt | 204/13 |
| 2,072,811 | 3/1937 | Ellsworth | 204/10 |
| 2,865,830 | 12/1958 | Zoldas | 204/208 |
| 2,903,403 | 8/1959 | Strauss | 204/32 |
| 3,220,897 | 11/1965 | Conley et al. | 428/606 |
| 3,293,109 | 12/1966 | Luce et al. | 428/556 |
| 3,322,656 | 5/1967 | Dahringer et al. | 204/38 A |
| 3,328,275 | 6/1967 | Waterbury | 204/38 |
| 3,454,376 | 7/1969 | Luce et al. | 204/27 |
| 3,461,046 | 8/1969 | Clancy | 204/13 |
| 3,518,168 | 6/1970 | Byler et al. | 204/32 |
| 3,585,010 | 6/1971 | Luce et al. | 204/44 |
| 3,699,018 | 10/1972 | Carlson | 204/27 |
| 3,857,681 | 12/1974 | Yates et al. | 204/27 |
| 3,918,926 | 11/1975 | Wolski et al. | 204/40 |
| 4,049,481 | 9/1977 | Morisaki | 156/151 |
| 4,053,370 | 10/1977 | Yamashita et al. | 204/13 |
| 4,073,699 | 2/1978 | Hutkin | 204/13 |
| 4,088,544 | 5/1978 | Hutkin | 204/12 |
| 4,149,953 | 4/1979 | Rojo | 204/276 |
| 4,193,846 | 3/1980 | Barrett | 204/13 |
| 4,197,180 | 4/1980 | Woodward | 204/275 |
| 4,401,523 | 8/1983 | Avellone | 204/15 |
| 4,468,293 | 8/1984 | Polan et al. | 204/27 |
| 4,490,218 | 12/1984 | Kadija | 204/216 |

FOREIGN PATENT DOCUMENTS

| | | | |
|---|---|---|---|
| 1371510 | 10/1964 | France | 204/15 |
| 112145 | 3/1975 | German Democratic Rep. | 204/27 |
| 134785 | 3/1979 | German Democratic Rep. | 204/27 |
| 494824 | 9/1970 | Switzerland | 204/27 |
| 1515361 | 6/1978 | United Kingdom | 204/15 |
| 1548550 | 7/1979 | United Kingdom | 204/27 |
| 2030176A | 4/1980 | United Kingdom | 204/27 |

OTHER PUBLICATIONS

Technologien Und Spezialausrustungen Zur Erzeugung Und Nachbehandlung Von Kupferfolien by W. Burkhart, Metall, Aug. 1978, pp. 791–793.
Copper Foil Production and Retreatment Plants brochure, provided by Kombinat Veb Lew.
Copper Foil brochure, provided by Kombinat Veb Lew.
Kupferfolien-Erzeugungs-und Nachbehandlungsanlagent brochure, provided by Kombinat Veb Lew.
Kupferfolien-Erzeugungsanlagen Typ KFE 1200.
Kupferfolien-Nachbehandlungsanlagen Typ KFN 1200 brochure, provided by Kombinat Veb Lew.

Primary Examiner—T. M. Tufariello
Attorney, Agent, or Firm—Barry L. Kelmachter; Howard M. Cohn; Paul Weinstein

[57] ABSTRACT

The present invention relates to a system and a process for producing improved quality electrodeposited and-/or treated metal or metal alloy foil to be used in electrical and electronic applications. The quality of the foil being produced and/or treated by the system is improved by providing each treatment tank in the system with a dual filtration system. The dual filtration system for each tank comprises a filter conditioning loop for substantially continuously withdrawing solution from the tank and removing particulate matter from the withdrawn solution and a system for removing surface impurities from the solution. In a first embodiment, the surface impurities removing system comprises an off-line solution filtration and replenishment system. In a second embodiment, the surface impurities removing system comprises a skimmer floating on the surface of the solution. The present invention has particular utility in systems for producing electrodeposited and/or treated copper foils.

22 Claims, 4 Drawing Figures

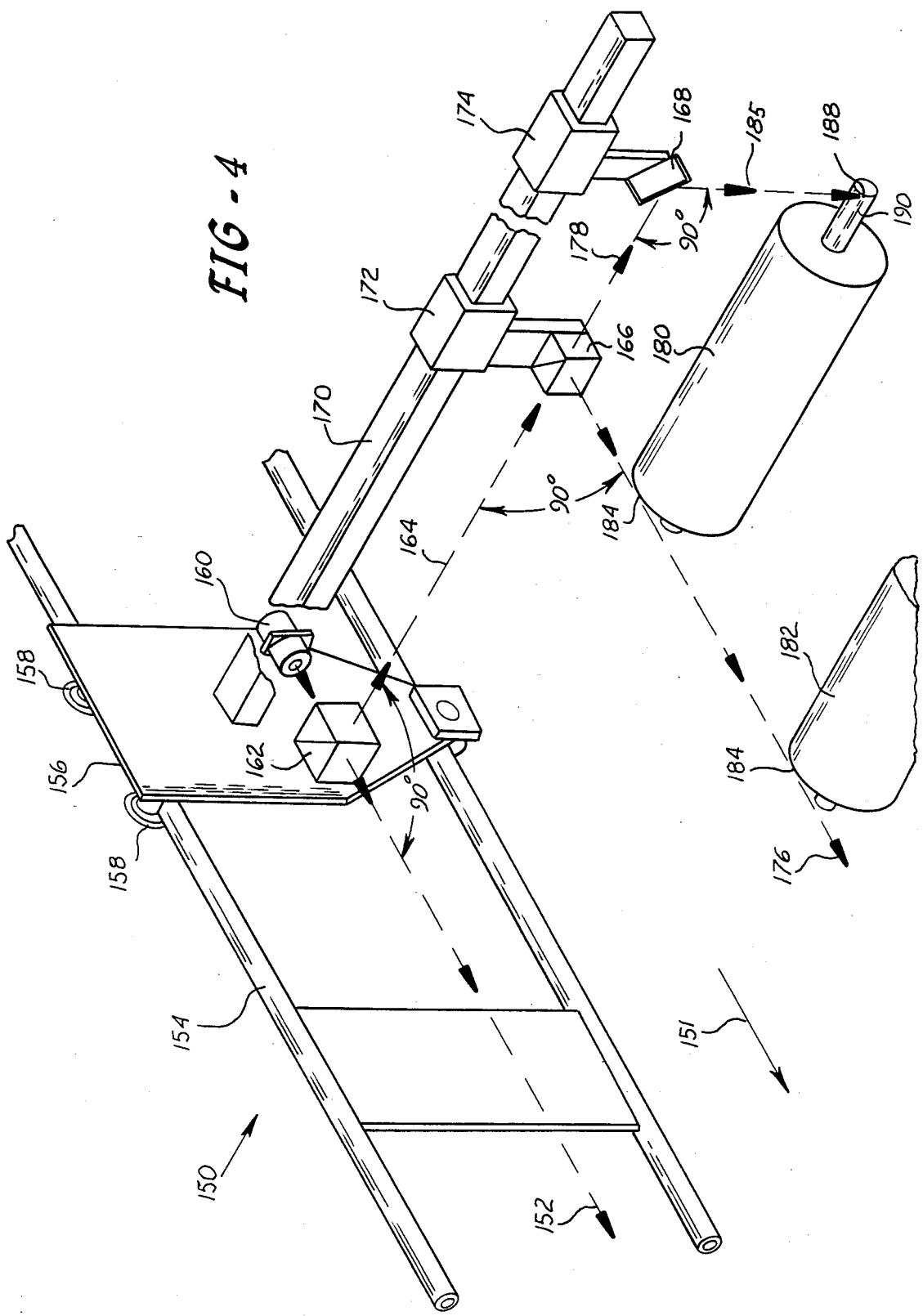

SYSTEMS FOR PRODUCING ELECTROPLATED AND/OR TREATED METAL FOIL

This application is related to allowed co-pending U.S. patent application Ser. No. 670,235, filed on an even date herewith, to Polan et al.

The present invention relates to a system for producing electrodeposited and/or treated metal or metal alloy foil having improved laminate adhesion. More particularly, the present invention relates to systems for electrochemically producing and/or treating copper or copper alloy foil for use in electrical and electronic applications.

Electrodeposition techniques for continuously producing metal or metal alloy foil from an electrolyte solution containing metal values is well known in the art. The ability to form high quality foil using these techniques is often related to the quality of electrolyte solution being used. The presence of impurities such as particulate matter from the atmosphere, grease and/or oil in the electrolyte solution can greatly diminish overall foil quality. To deal with this problem, some prior art electrodeposition systems have incorporated a single filtration loop for removing impurities from the electrolyte solution. U.S Pat. Nos. 1,417,464 and 1,425,184, both to Edison, illustrate one such filtration loop.

Today, most printed circuits are formed by bonding either electrodeposited or wrought metal foil to a substrate material, generally a synthetic polymer, with an adhesive and subjecting the composite structure to an acid etching treatment for forming the desired circuit. Because the adhesion between bare or untreated metal foil and non-metallic substrate materials tends to be weak, considerable effort has been directed toward the development of techniques for increasing the bond strength or laminate adhesion of the metal foil. These bond strength improvement techniques generally comprise roughening at least that surface of the metal foil to be bonded to the substrate material. When the metal foil to be used for the printed circuit comprises copper or copper alloy foil, the bond strength improving technique generally comprises one of several electrodeposition treatments known in the art for forming a plurality of dendritic structures on the foil surface to be bonded to the substrate material. These treatments are known as coral copper treatments in the art.

In most coral copper treatments, a nodular powdery copper layer, primarily a layer of copper or copper oxide particles, is electrodeposited onto the foil surface. These particles take the form of random nodular clusters that increase the over-all foil surface area. As a result of these nodular structures and the increase in foil surface area, stronger bonds which are predominantly mechanical in nature can be formed with the substrate material. In some treatments, a second layer called a locking layer is plated over the dendritic layer. Typically, this second layer is non-dendritic in nature and conforms to the shape of the dendritic layer. Its function is to reduce the powder transfer characteristics of the dendritic layer and to maintain the configuration of the dendritic structures intact during subsequent circuit fabrication. The locking layer may be a copper or copper alloy layer or a layer of some other metal or metal alloy such as nickel, cobalt, zinc, chromium and alloys thereof. Illustrative of the coral copper treatments known in the art are those shown in U.S. Pat. Nos. 3,220,897 to Conley et al., 3,293,109 to Luce et al., 3,322,656 to Dahringer et al., 3,585,010 to Luce et al., 3,699,018 to Carlson, 3,857,681 to Yates et al., 3,918,926 to Wolski et al., 4,049,481 to Morisaki, 4,053,370 to Yamashita et al. and Re. 30,180 to Wolski et al.

Recently, a technique has been developed for applying a coral copper treatment to copper or copper alloy foil using a current having regularly recurring pulses. In this technique, copper dendrites are formed on at least one surface of the copper or copper alloy foil during a first portion of each pulse and are bonded to the surface during a second portion of each pulse. It has been discovered that this technique, illustrated in U.S. Pat. No. 4,468,293 to Polan et al., forms well bonded, dendritic structures that significantly improve the adhesion properties of the treated foil.

One problem which has continually plagued both electrodeposited and treated foil producers is poor quality foil. For electrodeposited foil producers, the problem is avoiding the production of foil having a large number of pinholes and/or elemental impurities. For treated foil producers, the problem is mainly the uneven plating produced by some prior treatments. This uneven plating problem often takes the form of bare spots and unplated streaks on the treated foil. These bare spots and unplated streaks become zones of poor adhesion in the finished circuit board—a most undesirable condition, particularly with the current trend towards finer, narrower circuit lines and the use of thinner metal foils.

In accordance with the present invention, a system is provided for producing electrodeposited and/or treated metal foil having surface appearance, uniformity and reproducibility superior to that which is currently commercially available. The system of the present invention also provides economic benefits as well as improved quality foil.

The system of the present invention includes means for improving the quality of the electrochemical solutions used to produce the electrodeposited and/or treated metal foil. This means takes the form of a dual filtration system associated with each on-line processing/treatment tank. The dual filtration system for each tank has a solution conditioning loop through which solution from each on-line processing/treatment tank is continuously withdrawn and passed through a filter to remove suspended particulate matter. The dual filtration system also has means for removing surface impurities from the solution in each on-line tank. The surface impurity removing means may comprise a skimmer floating on the surface of the solution in the tank and/or an overflow system for removing solution from the tank and passing it through an off-line solution filtration/replenishment loop.

The system of the present invention has been found to be greatly useful in the production of treated metal foil having a reduced number of bare spots or unplated regions. In a preferred system for producing such foil, a strip of electrodeposited or wrought foil is first electrolytically cleaned in a caustic solution contained in a first treatment tank. After being cleaned, the foil is passed to a second treatment tank where a fresh layer of metal is formed, preferably electrolytically, on at least one surface of the foil. This fresh metal layer renders the at least one foil surface more uniformly electrochemically active and more receptive to the subsequent dendritic treatment. Immediately thereafter, the foil is passed to a third treatment tank where a plurality of dendritic structures are electrodeposited on and bonded to the surface(s) having the freshly formed metal layer. After the layer of dendritic structures has been formed on the foil, the foil is subjected to an anti-tarnishing treatment to improve its appearance. The anti-tarnishing treatment is applied by immersing the foil in an anti-tarnishing solution in yet another treatment tank. As a final step, the treated foil is washed and dried before being wound upon a take-up reel.

The metal foil treatment system also has, as part of the solution filtration/replenishment loop, a plurality of off-line tanks in which the solution for each treatment step may be initially made up and/or replenished. The provision of an off-line solution replenishment capability greatly reduces the costs associated with the foil treatment line. As previously mentioned, the solution filtration/replenishment loop may be used to remove surface impurities as well as other contaminants from the solution. The filtration/replenishment loop preferably includes at least one filter for removing contaminants and/or surface impurities from the solutions being withdrawn from and being transferred to the on-line tanks. As part of the solution filtration/replenishment loop associated with each on-line tank, the solution in each on-line tank may be withdrawn and replaced as a batch in response to a sensed condition of the solution or may be continuously withdrawn and replaced by fresh solution.

The ability of the present system to produce foil with improved quality is further enhanced by the provision of the solution conditioning loop for each treatment tank. Each conditioning loop has means for substantially continuously withdrawing solution from the treatment tank and circulating it through a filtering device to remove particulates and unwanted residual contaminants. If needed, each conditioning loop may have a heat exchanger for modifying the temperature of the withdrawn solution. Temperature modification of the solution may be needed to assist in the removal of the particulate and contaminants and/or to provide solution at a desired temperature back to the treatment tank.

In lieu of or in addition to using the solution filtration/replenishment loop to remove surface impurities, a skimmer may be placed in each on-line tank. Its discharge may be connected through appropriate conduits and valves to either the replenishment/filtration loop or the conditioning loop associated with the on-line tank.

In addition to providing improved treated foil, the present invention has been found to have applicability to the production of improved quality electrodeposited foil. To produce such foil, the electrochemical solution from which the foil is formed is continually filtered to remove surface impurities, particulate matter and other contaminants. The solution is continuously withdrawn from the electrodeposition processing tank and passed through a conditioning loop having a filter to remove particulate matter and unwanted chemicals from the solution. Any surface impurities are removed from the solution by a skimmer floating on the surface of the solution and/or solution overflow into a solution replenishment/filtration loop.

To consistently produce electrodeposited or treated metal foil of improved quality, the foil being produced and/or treated must accurately track through the various treatment/processing tanks. To this end, the present system includes a laser beam alignment system for aligning the various rolls over which the foil passes and with which the foil makes contact. The alignment system includes a reference system parallel to the direction of foil travel, a laser beam generator mounted to the reference system and movable optical devices for generating orthogonal alignment beams.

Accordingly, it is an object of the present invention to provide a system for producing treated metal foil having improved quality.

It is a further object of the present invention to provide a system as above for providing electrodeposited foil having improved quality.

It is a further object of the present invention to provide a system as above that provides significant economic benefits.

It is still a further object of the present invention to provide a system as above for forming and/or treating copper and copper alloy foil to be used in electronic and electrical applications.

These and other objects and advantages will become more apparent from the following description and drawings in which like reference numerals depict like elements.

FIG. 4 illustrates a laser alignment system to be used in either the system of FIG. 1 or the system of FIG. 3.

In accordance with the present invention, a system is provided for producing electrodeposited and/or treated metal foil of superior quality. The present system makes use of a dual filtration technique to remove particulate matter and other impurities from the solutions used to produce the electrodeposited and/or treated foil. Removal of the particulates and impuritites from these solutions removes one of the major causes of inferior quality foil. The system of the present invention has particular utility in providing metal or metal alloy foil for use in electronic and electrical applications.

While the present invention will be discussed in the context of producing and treating copper and copper alloy foils, it should be recognized that the present invention has wider applicability. Other metal and metal alloy foils of superior quality may be produced and treated using the present system.

As used herein, the term foils includes metal and metal alloy strip and sheet materials.

Figure 1:
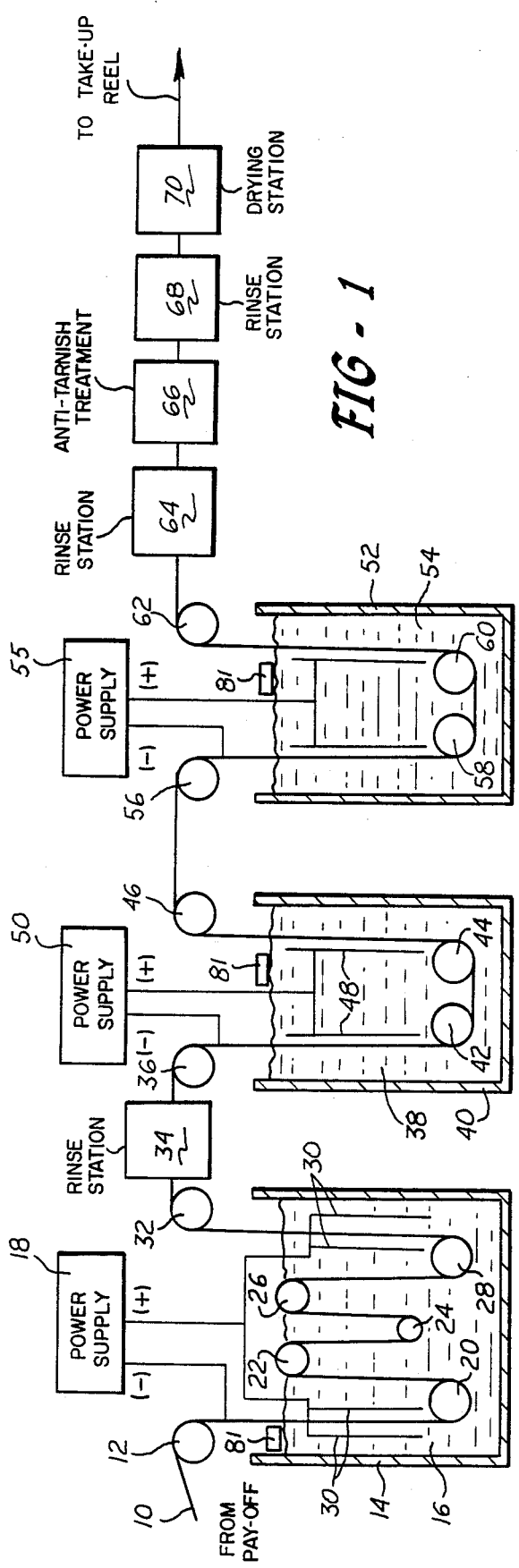
FIG. 1 is a schematic representation of a system in accordance with the present invention for treating metal foil.
Figure 2:
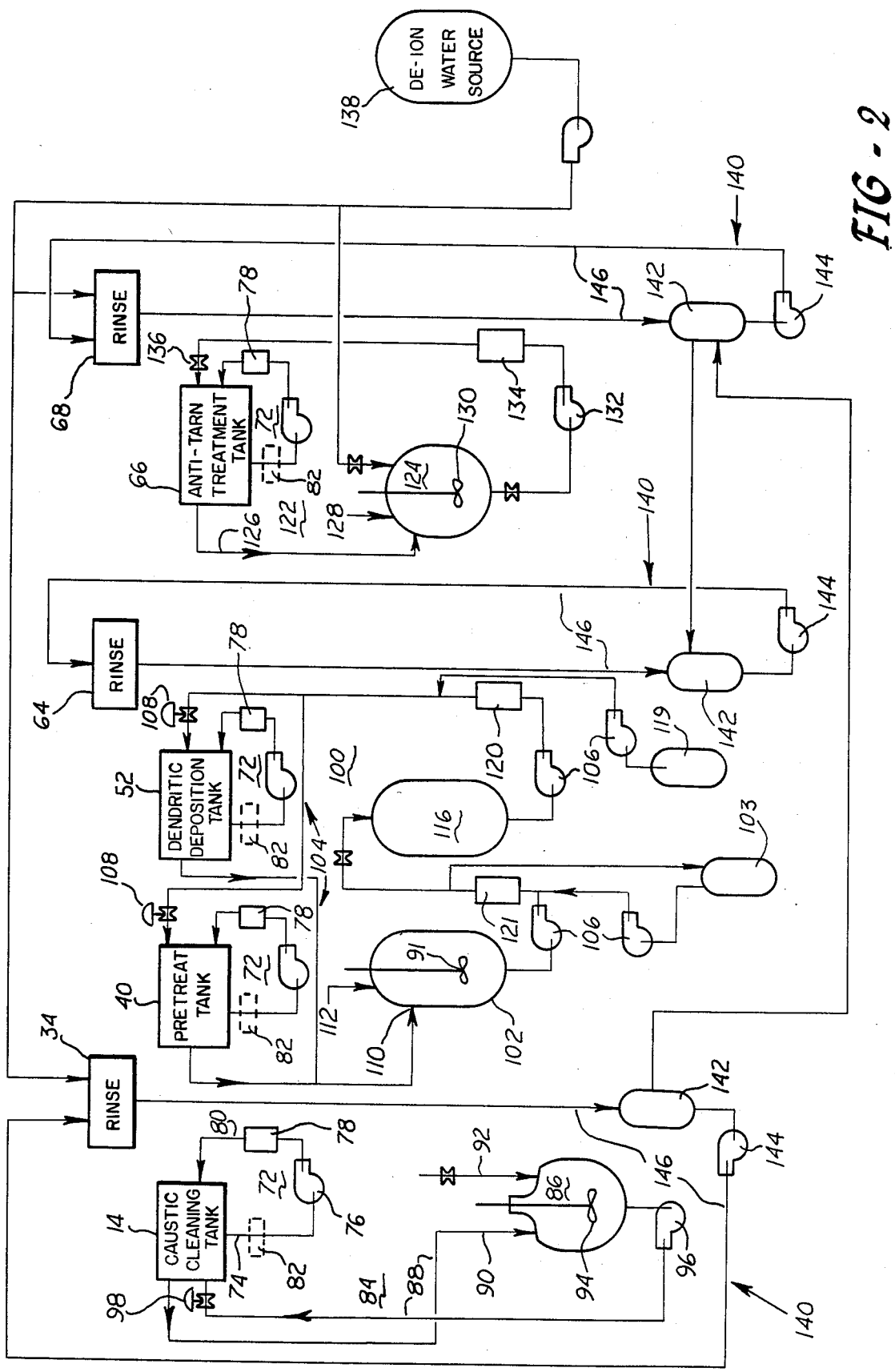
FIG. 2 is a schematic representation of the off-line processing tanks, solution replenishment/filtration loops and conditioning loops associated with the treatment tanks in the system of FIG. 1.

Referring now to FIGS. 1 and 2, a system for producing treated copper or copper alloy foil is illustrated. The copper or copper alloy foil 10 to be treated is payed off a reel not shown. The foil 10 may be either electrodeposited or wrought foil. If desired, the foil 10 may have been subjected to a preliminary cleaning treatment for removal of bulk oil and grease. This preliminary cleaning treatment may comprise any suitable treatment known in the art and may be done either on-line or off-line. The type of cleaning treatment and cleaning equipment used will of course depend upon the compositional nature of the foil 10 and the type or types of greases and/or oils to be removed. When the foil 10 is formed from a copper base material, bulk grease and oil are preferably removed by immersing the foil in a methylene chloride solution.

The initial treatment applied to the foil 10 by the system of FIGS. 1 and 2 is a cleaning treatment primarily designed to remove residual grease, oil and other contaminants from earlier processing of the foil. The foil 10 passes over a roll 12 and into a first treatment tank 14. The tank 14 contains a cleaning solution 16 designed to remove the residual contaminants, grease and oil. While any suitable cleaning solution and cleaning technique may be use in this initial treatment, it is preferred to electrolytically clean the foil 10 using a caustic cleaning solution. It is preferred to use such a technique because the electrolytic action enhances the solvent action of the caustic solution. More particularly, the agitation produced at the foil surfaces by the hydrogen bubbles generated from the electrolysis greatly facilitates the cleaning action of the solution. While any suitable caustic cleaning solution may be used to effect cleaning, it has been found that aqueous NaOH solutions, such as a 3%–15% NaOH solution or a solution that is a mixture of $NAOH$, $N_3PO_4$, $Na_2SiO_3$ and $Na_2CO_3$, provide excellent cleaning/degreasing results.

It has been found that improved cleaning results are obtained when the caustic cleaning solution 16 is kept at an elevated temperature. For NaOH solutions, the temperature of the solution 16 may be maintained in the range of about 40° C. to about the boiling temperature of the solution, preferably from about 50° C. to about 70° C. The solution in the tank 14 may be maintained at the desired temperature by means of an appropriate in-tank heater and control loop not shown. Any appropriate in-tank heater and control loop known in the art may be used.

The electrolytic cleaning is preferably performed by applying a cathodic current to the foil 10. The foil 10 passing through the cleaning solution 16 may be made cathodic by bearing against a roller, such as roller 12, which has been formed from an electrically conductive material such as copper and which is electrically connected to the negative terminal of a power supply 18. The power supply 18 may comprise any suitable DC or AC power supply known in the art.

The foil 10 may be passed through the cleaning solution in any known manner. For example, the foil may be threaded through a series of rollers 20, 22, 24, 26 and 28 immersed in the solution 16 so that the foil travels up and down in successive vertical planes through the length of the tank. Vertical anode plates 30 may be fixed in the tank 14 facing the foil surfaces. The plates 30 may be mounted in the tank in any suitable manner known in the art and may be electrically connected to the positive terminal of the power supply 18 in any known manner. The plates 30 may be formed from any suitable electrically conductive material known in the art, such as lead and lead alloys, platinum and stainless steel, which is also inert to the cleaning solution 16. Cleaning may be effected when using a NaOH solution by aplying an electrolysis current density of about 1.0 $mA/cm^2$ to about 500 $mA/cm^2$, preferably from about 25 $mA/cm^2$ to about 200 $mA/cm^2$, to the anode plates 30 and the foil 10.

While it is preferred to cathodically clean the foil 10, the electrical polarity can be reversed and the foil 10 may be cleaned anodically with similar results. Alternatively, acid cleaning of the foil 10 may be used in lieu of caustic cleaning.

After being cleaned, the foil 10 passes over exit roller 32 and through a rinse station 34. If desired, the foil 10 may pass through a bank of air nozzles not shown prior to exiting the tank 14 to prevent carryover of excess cleaning solution. In the rinse station, a fluid such as water is sprayed over the foil 10. The action of the fluid spray removes any loose particles on the foil and washes away unwanted chemicals left by the caustic cleaning solution. The incorporation of a rinse station at this point of the processing line is also desirable from the standpoint that downstream chemical solutions will not be contaminated by the chemicals in the caustic cleaning solution. The rinse station will be described more fully hereinafter.

After rinsing, the foil 10 is subjected to a treatment for rendering its surface(s) more uniformly electrochemically active and receptive to subsequent electrochemical treatment. It has been found that by performing this treatment the number of bare spots or unplated regions present on the treated surface of the foil 10 after a dendritic treatment has been applied may be significantly reduced. The import of this is that when the treated foil is eventually laminated to a substrate material fewer regions of poor adhesion are present and the bond between the treated foil and the substrate material is materially stronger.

The treatment applied to the foil 10 for rendering the surfaces more uniformly active preferably comprises electrodeposition of a very thin, substantially uniform layer of copper on each surface to be treated. This copper layer or copper strike may be formed by passing the foil 10 over roller 36 and into the electrolyte solution 38 in treatment tank 40. The foil 10 is again rendered cathodic by electrically connecting it to the negative terminal of a power supply. The power supply may be the same as that used in the previous cleaning step or may be a separate power supply 50. The foil 10 may be connected to the power supply in any suitable manner such as by contact with one or more electrically conductive rollers. If a separate power supply is used, the power supply 50 may comprise any suitable DC or AC power supply known in the art.

The tank 40 may be provided with a plurality of rollers such as rollers 36, 42, 44 and 46 arranged to make the foil 10 loop through the electrolyte solution 38 in a desired manner. Preferably, a plurality of anodes or anode plates 48 are immersed in the electrolyte solution 38. The anodes or anode plates may be electrically connected to the positive terminal of whatever power supply is being used to apply the cathodic current to the foil 10. The anodes or anode plates may be connected to the power supply being used in any suitable manner known in the art. In addition, the anodes or anode plates 48 may be formed from either consumable materials such as copper or formed from or surfaced with non-consumable metals and metal oxides including platinum, lead and lead alloys such as Pb-6% Sb. When metals such as lead and lead alloys are used it is desirable to bag each anode or anode plate 48 to prevent particulate from contaminating the electrolyte solution. The anodes or anode plates 48 are preferably mounted in the tank 40 in vertical planes parallel to the foil surface. Any suitable means known in the art may be used to mount the anodes or anode plates 48 in the tank 40.

When treating copper base foil materials, the electrolyte solution 38 used to form the copper strike layer preferably comprises an aqueous copper sulfate-sulfuric acid solution having a composition identical to that of the solution to be used during the dendritic treatment stage. The specific composition for the electrolyte solution, the temperature at which the solution may be used and the current density to be applied to form the copper strike layer are more fully described in co-pending U.S. patent application Ser. No. 670,236 filed on an even date herewith, to Parthasarathi et al., which is hereby incorporated by reference herein.

While it is preferred to form the thin copper strike layer on the foil 10 in the manner described in the aforementioned co-pending Parthasarathi et al. application, light electrochemical etching of the foil surface may be employed in lieu of the plating treatment to render the surface more uniformly electrochemically active. The etching treatment may be carried out in any desired manner using any suitable etching technique and solution known in the art. Alternatively, the thin copper strike layer may be formed using the technique described in co-pending U.S. patent application Ser. No. 670,239, filed on an even date herewith, to Pathasarathi, which is also hereby incorporated by reference herein, or using a pulse plating technique.

While the copper strike layer is still fresh, the foil 10 is passed from the treatment tank 40 to the treatment tank 52 where a dendritic treatment is applied to the foil. The dendritic treatment comprises electrodeposition of a plurality of dendritic structures on at least one surface of the foil 10 and bonding of the dendritic structures thereto. The specific technique for forming the dendritic structures and for bonding them to the foil surface(s) is more fully described in U.S. Pat. No. 4,468,293 to Polan et al., which is also incorporated by reference herein.

To perform this dendritic treatment, the foil 10 is passed through an electrolyte solution 54 and rendered cathodic such as by contacting one or more conductive rollers electrically connected to the negative terminal of a power source 55. The foil 10 may be passed through the solution 54 in any suitable manner such as by rollers 56, 58, 60 and 62.

As previously mentioned, the solution 54 preferably has the same composition as the solution 38. In a preferred manner of performing the foil treatment described herein, the temperature of the solution 54, however, is kept lower than the temperature of the solution 38. The reason for doing this is related to the line speed requirements for the processing line. To maintain a desired substantially constant line speed throughout the system, it has been found to be necessary to apply a current density to the foil 10 and the solution 38 in the copper strike layer treatment tank 40 greater than that allowed by operating at the temperature of the solution 54. This is done to increase the amount of copper being plated in the treatment tank 40 for a given period of time. Since the solution 38 ideally has the same composition as the solution 54, its limiting current density has to be raised to prevent formation of dendritic structures in the tank 40 while effecting the required plating. Raising the limiting current density of the solution 38 is preferably done by maintaining the solution 38 at a higher temperature than the solution 54. It has been found that keeping the temperature of the solution 38 at a temperature in the range of slightly above room temperature to about the boiling temperature of the solution, preferably at a temperature in the range of about 40° C. to about 60° C., while at the same time maintaining the temperature of the solution 54 at a temperature in the range of about room temperature to about 60° C., preferably from about room temperature to about 40° C., produces the desired results. The tanks 40 and 52 may be provided with any suitable temperature maintenance and control devices (not shown) known in the art to keep the solutions 38 and 54 at the desired temperatures.

After the dendritic treatment has been applied, the foil 10 is passed through a rinse station 64. If desired, the foil 10 may be passed through a bank of air nozzles not shown prior to exiting the tank 52 to prevent the carryover of excess plating solution. The rinse station 64 sprays a fluid such as water over the foil surfaces to remove any loose particles on the surfaces and wash away unwanted chemicals left by the electrolyte solutions 38 and 54. The incorporation of a rinse station at this point is again desirable from the viewpoint of preventing the contaminantion of the subsequent treatment bath. The rinse station 64 will also be discussed in more detail hereinafter.

The final treatment to which the foil 10 is preferably subjected to an anti-tarnishing treatment. The anti-tarnishing treatment is needed because dendritic copper surfaces are highly susceptible to atmospheric corrosion. If allowed to remain wet after production, dendritic copper foil will turn dark within minutes. Even if it is dried immediately, the dendritic copper foil will tarnish within days. This tarnishing is the result of the formation of a surface oxide layer. The surface oxide layer develops rapidly because of the dendritic copper's high surface area and the high chemical activity of freshly plated metal.

In the anti-tarnishing treatment tank 66, the foil 10 is coated with a thin film that prevents tarnishing. The anti-tarnishing solution in the tank 66 may be any of many commercially available solutions such as a chromic acid solution. It is desirable to maintain the anti-tarnishing solution at an elevated temperature in the range of slightly above room temperature to about 80° C. to obtain good anti-tarnishing results. To this end, the tank 66 may be provided with suitable temperature maintenance and control devices not shown. The temperature maintenance and control device used may comprise any suitable temperature maintenance and control device known in the art.

After the anti-tarnishing treatment has been applied, the foil 10 may be passed through another rinse station 68. The rinse station 68 may be identical in construction to the rinse stations 34 and 64.

It has been found to be desirable for the design of the various rinse stations to incorporate the following consideration. The foil in the rinse area or areas because of its fragile nature needs to be closely supported by having short spans between adjacent rollers over which and through which the foil travels. A rinse that will be flowed could be used instead of the spray. Applying the aforementioned consideration, each of the rinse stations 34, 64 and 68 preferably has a plurality of spray nozzles not shown arranged about the periphery of the foil to spray fluid onto both sides of the foil 10. While the spray nozzles may be arranged in any suitable configuration and may have any desired nozzle pattern, it is preferred that the spray nozzles be arranged in banks of adjacent square pattern nozzles on opposed sides of the foil 10.

Before the treated foil is coiled on a take-up reel not shown, it may be dried. Numerous drying processes which may be used are known in the art. One such process which may be used embodies a water blow-off stage followed by a hot air tunnel drying stage. An alternative process which may be used utilizes heated blow-off air for both bulk and evaporative water removal. In this latter process, the hot air can be directed against the foil when it is lying on drum rollers in the line. In still other alternative processes, at least one internally heated drum roller or infra-red heating may be used to dry the foil. The drying station 70 may incorporate any of these drying processes.

To consistently produce treated foil of superior quality, it is believed that three things are necessary. First, the solution in each treatment tank must be continually conditioned to remove undesirable particulates, chemical impurities and residual grease and oil that can adversely affect the quality of the treated foil. Second, treatment temperatures must be maintained at substantially constant values. Third, the concentration of chemicals in each solution must be maintained at a substantially constant level. To this end, a dual filtration system and a solution replenishment system are associated with each of the treatment tanks 14, 40, 52 and 66.

Referring now to FIG. 2, each treatment tank has a solution conditioning loop 72 associated with it. This solution conditioning loop forms one leg of the dual filtration system associated with each treatment tank. Each solution conditioning loop 72 comprises conduits 74 and 80 for withdrawing solution from and returning solution to the treatment tank, a pump 76 for circulating the solution through the conduits, and a filter 78 for conditioning the solution. While it is preferred to continually withdraw solution from each treatment tank and condition it through the loop 72, appropriate valve means not shown may be incorporated into the loop 72 to control the amount of solution being withdrawn at a given moment. The pump and the valve means may comprise any suitable pump and valve arrangement known in the art.

The filter 78 is primarily used to remove particulate and other impurities, suspended or unsuspended, from the solution. In some situations, it may be desirable for the filter to also be capable of removing organic contaminants that may be carried over from previous bath solutions or may have come from the atmosphere. While any filter known in the art capable of removing these materials from the solutions may be used, it is preferred to use commercially available polypropylene cartridge type filters for the filters 78.

Where it is necessary to change the temperature of the withdrawn solution either to promote filtration or to provide solution at a desired temperature back to the treatment tank, a heat exchanger 82 may be incorporated into the conditioning loop. Any suitable conventional heat exchanger known in the art may be incorporated into the conditioning loop.

The second leg of the dual filtration system of the present system comprises means for removing surface impurities and contaminants from the various treatment baths. To this end, each treatment tank may be provided with a floating skimmer 81. Any suitable skimmer known in the art may be used to remove surface impurities and contaminants. The skimmer discharge may be connected to any suitable means for removing the surface impurities and the contaminants. For example, the skimmer discharge may be connected to the suction side of the conditioning loop pump 76 by appropriate conduits and valves. By providing such an arrangement, the solution removed by the surface skimmer could be passed through the filter 78 and returned to the tank by conduit 80.

In addition to or in lieu of the skimmer 81, a solution overflow system that removes solution above a desired level from the tank may be employed to remove the surface impurities or contaminants from each treatment tank. The solution overflow system may comprise any suitable arrangement of conduits, pump, valves and filters for removing solution above the desired level and the surface impurities and contaminants. In a preferred embodiment, the solution overflow system forms part of a solution replenishment/filtration loop associated with each treatment tank. While the components forming each conditioning loop 72 are essentially the same for each treatment tank, the components making up the solution replenishment/filtration loop for each treatment tank differ. This difference is a reflection of the different requirements associated with each treatment solution such as the different compositions of the solutions and/or the different impurities and contaminants which may be encountered during solution replenishment and filtration.

The solution replenishment/filtration loop 84 for the caustic cleaning solution preferably includes an off-line solution preparation/holding tank 86 and a conduit network 88 for withdrawing contaminated and/or depleted solution from and for providing fresh cleaning solution to the tank 14. The off-line tank 86 may have one or more inlets 90 and 92 through which the chemicals needed to form the desired cleaning solution may be introduced. If needed, the tank may be provided with a stirrer 94 to mix the chemicals together and a heating/cooling means not shown for providing fresh cleaning solution at a desired temperature. The stirrer and the heating/cooling means may comprise any suitable stirring and heating/cooling devices known in the art.

The conduit network 88 preferably has a pump 96 and one or more valves 98. The valve(s) 98 may be used to withdraw the solution and replace it as a batch. The valves could be operated automatically or manually in response to a sensed condition of the cleaning solution 16. For example, the solution 16 may be withdrawn from the tank 14 when the operator visually sees unemulsified oils on the surface of the solution, when the foil exiting the tank exhibits a lack of wetting, and/or when there are a significant number of unplated regions of spots on the treated foil. Where desired, the valves 98 may be omitted or controlled to permit continuous withdrawal of solution 16 from the tank 14 and a continuous flow of fresh solution 16 to the tank 14. As previously mentioned, continuous withdrawal of the solution may be used to effect removal of surface impurities and contaminants.

With respect to the treatment of the solutions 38 and 54 in the tanks 40 and 52 respectively, a single solution replenishment/filtration loop 100 may be used to treat both solutions. This is possible because they have the same chemical make-up. The loop 100 has a conduit network 104 for withdrawing solution from and providing fresh solution to the tanks 40 and 52 and an off-line tank 102 for receiving withdrawn/depleted solution to be reconditioned. In addition to the receiving/reconditioning tank 102, the system 100 may include an off-line solution holding tank 116 for storing reconditioned solution to be provided to the treatment tanks. The conduit network 104 preferably comprises one or more pumps 106 and a plurality of valves 108 associated with the various conduit lines forming the network 104. The pump and valves may be any conventional pump and valves known in the art.

To recondition the solution from either treatment tank 40 or 52, the withdrawn and/or depleted solution enters the tank 102 through the inlet 110. When copper sulfate-sulfuric acid solutions are used as the treatment baths 38 and 50, the solution reconditioning problem centers about restoration of the copper and sulfuric acid concentrations. During the copper strike and dendritic treatments, the copper concentration in the solutions 38 and 54 decreases. This is due to the fact that copper is being removed from the solution to be plated or deposited onto the foil 10. At the same time, the sulfuric acid concentration in the solutions increases because sulfuric acid is generated by electrolysis of the bath solution. The concentration of copper and sulfuric acid in the withdrawn solution must be returned to the desired concentration levels in order for the solution to be reusable. Generally, there are two techniques available to return the copper and sulfuric acid concentrations to the desired levels—these are replenishment of the copper values by adding copper salts to the depleted/withdrawn solution or replenishment of the copper values by digestion of metallic copper. In small systems, the preferred approach to replenishing the copper values is to use copper salts.

The copper and sulfuric acid concentrations may be restored to the desired levels by dissolving copper or a copper salt such as cupric oxide or cupric carbonate in the withdrawn solution in the tank 102. The copper salt is preferably supplied to the tank 102 through the inlet 112. The dissolution of the salt into the withdrawn/depleted solution proceeds to neutralize some of the sulfuric acid by forming copper sulfate with the electrolytically produced sulfuric acid. The formation of the copper sulfate returns the sulfuric acid concentration to the desired level and provides the solution with fresh copper values that may be plated or deposited onto the foil. The advantage of this technique is that there is no need to remove acid values as an insoluble compound via a filtration operation.

A stirrer 91 may be provided in the tank 102 to mix the materials in the tank. If needed, a heating/cooling loop not shown may also be provided within the tank. The stirrer and the heating/cooling loop may comprise any conventional stirrer and heating/cooling loop known in the art.

In a preferred embodiment, a plurality of filters 120 and 121 are incorporated into the system 100. The filters 120 and 121 are used to remove contaminants such as unwanted chemicals, organic materials, grease, oil and particulate that may be present in the withdrawn solution and/or may have entered the reconditioned solution during the reconditioning process. While any suitable filters known in the art may be used for filters 120 and 121, it is preferred to use a horizontal plate filter for filter 121 and a polypropylene cartridge filter for filter 120. To assist removal of carbonaceous materials, e.g. active carbon deliberately added for purification of the solution, from the depleted/withdrawn solution, a filtering aid such as diatomaceous earth may be incorporated into the tank 102. If desired, a filter aid slurry preparation tank 103 may also be provided.

Where the solutions 38 and 54 contain a surfactant such as lauryl sulfate or sodium dihexyl sulfosuccinate to assist in plating and which needs to be replenished, the loop 100 may be provided with appropriate means for adding surfactant to the solution being returned to the tanks 40 and 52. For example, the loop 100 may be provided with a surfactant feed tank 119, a pump 106 and appropriate conduits.

The solution in either treatment tank 40 or 52 may be withdrawn either in a batchwise fashion or in a continuous fashion. When removed in a batchwise fashion, removal may be in response to a sensed condition of the solution. For example, solution may be withdrawn when analytical analysis of the solution shows that the copper concentration has decreased by a certain percentage. Continuous removal of the solution in the treatment tanks 40 and 52 may be used to remove surface contaminants such as grease and oil floating on the surface of the solution. As previously mentioned when continuous removal of solution is used to remove surface contaminants, an overflow arrangement such as a solution overflow pipe not shown may be incorporated into the loop 100.

The solution replenishment/filtration loop 122 associated with the anti-tarnishing treatment tank 66 includes an off-line solution preparation/holding tank 124 and a conduit network 126 for withdrawing depleted solution from and for providing fresh solution to the treatment tank 66. The tank 124 may have one or more inlets 128 through which the chemicals needed to replenish the anti-tarnishing solution may be introduced into the tank 124. The tank 124 may be provided with a stirrer 130 to mix the chemicals together and a heating/cooling loop not shown for providing fresh solution at a desired temperature. The stirrer and the heating/cooling loop may comprise any conventional stirrer and heating/cooling loop known in the art.

The conduit network 126 preferably includes a pump 132 and one or more valves 136. The valve(s) may be operated to withdraw depleted solution from and provide fresh solution to the tank 66 in a batchwise fashion in response to a sensed condition of the solution such as the chromate ion concentration in the solution. The valve(s) 136 may be operated automatically or manually. If desired, the valve(s) 136 may be operated to substantially continuously withdraw solution from the tank 66 and replace it with fresh solutiion. When a continuous solution withdrawal/feed system is used, the treatment tank 66 is preferably provided with an overflow capability such as an overflow pipe in order to provide removal of surface contaminants. If needed, a filter 134 may be incorporated into the network 126. The filter 134 should be of the type that will remove particulate matter such as dust and atmospheric debris, grease and/or oil from the solution being supplied to the tank 66. Any suitable filter known in the art for removing such contaminants and impurities may be used for the filter 134.

While any suitable fluid may be sprayed on the foil by the rinse stations 34, 64 and 68 to remove loose particles and wash away unwanted chemical contaminants, it is preferred to use de-ionized water. To this end, the metal treatment system shown in FIG. 2 may be provided with a source of de-ionized water 138 and a conduit network for transferring the water to and from the various rinsing stations. If desired, each rinsing station may have a water recycling loop 140 associated with it. Each water recycling loop 140 preferably includes a surge tank or a sump 142, a pump 144 and conduits 146 to remove water from and provide water to the rinse station. If needed, de-ionized water from the source 138 may be transferred to one or more of the off-line solution preparation tanks 86, 102 and/or 124 to assist in preparation of fresh solution. Appropriate conduits may be provided to transfer the water from the source 138 to the tank(s) 86, 102 and/or 124.

Figure 3:
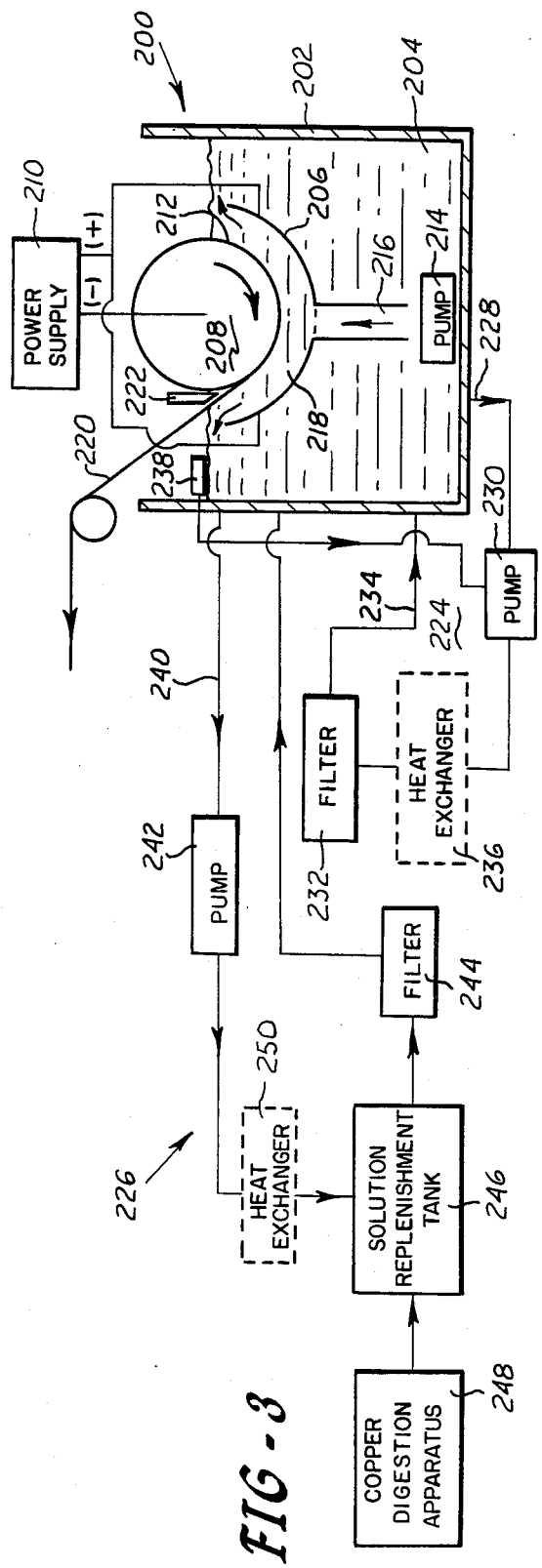
FIG. 3 is a schematic representation of a system in accordance with the present invention for producing electrodeposited foil.

Referring now to FIG. 3 a system 200 for producing electrodeposited metal foil is illustrated. The system 200 includes a tank 202 containing an electrolyte solution 204, an anode 206 and a cathode 208. The anode 206 and the cathode 28 may be electrically connected to a power source 210 in any desired manner. The power source 210 may comprise any suitable power supply known in the art such as a DC power supply. The cathode 208 preferably comprises a rotating drum having a relatively smooth plating surface 212 at least partially immersed in the electrolyte solution. The anode 206 preferably has an arcuate configuration and is mounted in the tank 202 so that it is substantially concentric with the rotation axis of the drum cathode. In addition, the anode preferably has a central perforated zone through which electrolyte is pumped by a pump 214 into a manifold 216 and into the gap 218 between the anode and the cathode. The system 200 and its components are more fully described in co-pending allowed U.S. patent application Ser. No. 568,676, filed on Jan. 6, 1984, to Polan, which is hereby incorporated by reference herein.

The electrolyte solution 204 generally comprises an acidic solution containing a concentration of metal ions to be plated onto the cathode plating surface 212. For forming electrodeposited copper foil, the solution 204 preferably comprises a copper sulfate-sulfuric acid solution. The compositional specifics of the copper sulfate-sulfuric acid solution and the temperature ranges at which it may be used are more fully described in the aforementioned Polan patent application.

In operation, the cathode 208 is rotated at a desired speed and a current having a suitable current density is applied between the cathode 208 and the anode 206. The electrolyte is circulated upward through the manifold 216 into the interelectrode gap 218 and permitted to spill over the edges of the anode 206 back into the tank 202. While the plating surface 212 is immersed in the electrolyte and a current is being applied, metal is deposited thereon. The metal deposit generally takes the form of a relatively thin, relatively smooth, continuous strip of metal foil 220. After the plating surface emerges from the electrolyte, the metal foil is removed or peeled from the surface. Any suitable means 222 known in the art may be used to remove the foil from the plating surface. For example, the metal foil may be removed using one of the peeling devices illustrated in U.S. Pat. Nos. 2,865,830 to Zoldas and 3,461,046 to Clancy.

As previously mentioned, one of the main impediments to consistently producing electrodeposited foil of superior quality is the presence of impurities in the electrolyte bath 204. To remove unwanted impurities, a dual solution filtration system is associated with the processing tank 202. The dual filtration system comprises a solution conditioning loop 224 to primarily remove particulate matter from the solution and a means for removing surface contaminants from the solution.

The solution conditioning loop 224 preferably comprises a conduit 228 for withdrawing solution from the tank 202, a pump 230, a filter 232 and a return conduit 234 for returning solution to the tank 202. Where the solution temperature has to be modified either to assist in the filtration process and/or to return solution at a particular temperature to the tank 202, a heat exchanger 236 may be incorporated into the loop 224. The heat exchanger 236 may comprise any suitable heat exchanger known in the art. The filter 232 may comprise any suitable filter known in the art for removing particulate matter such as organic debris from the atmosphere and other unwanted impurities. Cartridge type filters such as polypropylene cartridge filters appear to have particular utility in such a conditioning loop.

To remove surface contaminants and/or impurities such as greases and oils, the tank 202 may be provided with a skimmer 238 that floats on the surface of the solution 204. As before, the skimmer may comprise any suitable skimmer known in the art. Its discharge may be connected to the suction side of the pump 230 so that solution removed from the tank by the skimmer 238 passes through the filter 232.

In lieu of or in addition to the skimmer 238, surface impurities and/or contaminants may be removed by causing solution to be continuously withdrawn from the tank 202 and passed through a solution replenishment/filtration loop 226. The solution replenishment/filtration loop 226 preferably comprises a network of conduits 240, a pump 242 for circulating solution through the conduits, a filter 244 and an off-line solution replenishment and holding tank 246. To remove surface impurities, the conduit network 240 may include an overflow pipe for removing solution above a desired level. Any suitable technique known in the art may be used to replenish the metal values in the withdrawn/depleted solution. For example, any suitable elemental digestion system 248 known in the art such as a scrap wire digestion system may be used to replenish the copper values in a copper sulfate-sulfuric acid electrolyte solution. The filter 244 may comprise any suitable filter known in the art such as a cartridge type filter capable of removing the impurities and/or contaminants generally associated with the withdrawn electrolyte solution and the particular replenishment technique employed.

If desired, the loop 226 may also include a heat exchanger 250. The heat exchanger may comprise any suitable heat exchanger known in the art and may be used to assist in the filtration of the solution or to provide solution at a desired temperature.

While a system for producing electrodeposited foil has been illustrated in FIG. 3, it should be recognized that the foil produced by the system 200 may be subjected to other treatments. For example, the foil may be subjected to an anti-tarnishing treatment after it leaves the tank 202. Alternatively, the electrodeposited foil may be subjected to the treatments illustrated in FIG. 1.

Another consideration which has been found to be important to the production of superior quality foil has to do with the handling of the foil during processing. During processing, the foil 10 passes over the comes into contact with a plurality of rollers. It has been found that these rollers must be carefully aligned to avoid damage to the relatively thin, delicate foil 10. The present systems preferably have incorporated therein an alignment system 150 capable of setting the rollers and the roll axis of each roller in a desired manner that enables the foil to accurately track through the system.

Referring now to FIG. 4, the alignment system 150 performs alignment of the rolls by tracking a beam 152 of light parallel to the direction 151 of movement of the foil through the processing line or system and using an optically set square and parallel ruler as references for aligning the rollers. The alignment system 150 has a reference frame such as a horizontal track optical bench 154 extending the entire length of the particular processing or treatment line. The bench or frame 154 has a longitudinal axis parallel to the foil movement direction. Mounted to the bench 154 is a trolley 156 that is free to move along the entire length of the bench. The trolley 156 may be provided with rollers 158 or other equivalent devices for permitting movement along the bench.

The reference light beam 152 is formed by mounting a source of light such as a laser beam generator 160 to the trolley 156 in any suitable manner. The generator 160 is mounted to the trolley 156 so that the reference beam 152 is formed parallel to the foil movement direction through the processing and/or treatment tanks. The laser beam generator 160 may comprise any suitable laser beam generator known in the art such as a one milliwatt helium-neon red laser beam generator.

In addition to the laser beam generator, a beam splitter 162 is mounted to the trolley 156. The beam splitter 162 preferably comprises an optical device for redirecting a first portion 164 of the light beam produced by the generator 160 at an angel of 90° to the longitudinal axis of the bench 154 and for permitting a second portion of the beam produced by the generator to pass through and form the reference beam 152. The beam splitter may be mounted to the trolley in any suitable manner.

The redirected portion 164 of the light beam is what is used to align each of the rollers in two planes. Generation of the roller alignment beams is done by mounting a beam splitter 166 and a mirror 168 to an arm 170 mounted to the trolley 156. The arm 170 is mounted to the trolley 156 so that it is perpendicular to the longitudinal axis of the bench. The beam splitter 166 and the mirror 168 are preferably mounted to the arm 170 in a manner that enables them to slide along the arm. Any suitable sliding means 172 and 174 known in the art may be used to mount the beam splitter 166 and the mirror 168 to the arm 170.

The beam splitter 166 splits the beam 164 into two portions 176 and 178. Any suitable optical device known in the art such as a half silvered mirror may be used to split the beam 164 into the two desired portions. The first beam portion 176 extends parallel to the reference beam 152 and is used to align the sidewalls of the rollers in a plane parallel to the reference beam. FIG. 4 illustrates a plurality of rollers 180 and 182 having sidewalls 184 aligned by the beam 176.

The second beam portion 178 is used to align the roll axis of each roller. This is done by redirecting the beam 178 in a perpendicular direction 185. Preferably, an optical device 168 such as a mirror is used to redirect the beam 178. The redirected beam 185 is then focused onto a series of targets 188 on the axles 190 of the rollers. By aligning the targets on both sides of each roller, the roll axis of each roller may be aligned to be perpendicular to the reference beam.

The provision of the trolley 156 enables each roller to be individually aligned. Similarly, the provision of sliding means 172 and 174 for beam splitter 166 and mirror 168 enables alignment of both sides of each roller.

While the optical alignment system has been described as having a horizontal reference frame, a plurality of stands aligned in a direction parallel to the direction of foil travel could be used in lieu of the frame 154. When using such an arrangement, the trolley 156 may be replaced by any suitable support structure for mounting the laser beam generator and optical alignment devices to each stand.

In accordance with the foregoing description, a system for producing metal foil of superior quality has been described. Using this system, treated foil surfaces have been obtained with better and more reproducible properties than are currently available on wrought copper printed circuit foil.

While the foil treatment system of the present invention has been described as applying an anti-tarnishing treatment after the dendritic treatment, additional non-copper metal electrodeposition stages with appropriate off-line support may be provided intermediate the dendritic treatment stage and the anti-tarnishing composition application stage.

While a single replenishment/filtration loop 100 for treating the solutions 38 and 54 in tanks 40 and 52, respectively, has been illustrated in FIG. 2, each of the treatment tanks may be provided with individual solution replenishment/filtration loops if so desired.

The U.S. patents and patent applications set forth in this specification are intended to be incorporated by reference herein.

It is apparent that there has been provided in accordance with this invention systems for producing electroplated and/or treated metal foil which fully satisfy the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to cover all such alternatives, modifications, and variations as fall within the spirit and broad scope of the appended claims.

What is claimed:

1. A system for producing metal or metal alloy foil, said system comprising:
   at least one treatment tank containing a solution:
   first means for removing impurities floating on the surface of said solution; and
   second means for withdrawing solution from said at least one tank and for removing particulate matter from said withdrawn solution.

2. The system of claim 1 wherein said second means comprises:
   a solution conditioning loop associated with each said treatment tank, each said solution conditioning loop having conduit means for withdrawing said solution from and returning fresh solution to each said associated tank, a pump for circulating said solution through said loop and a first filtering means for removing said particulate matter.

3. The system of claim 2 further comprising:
   each said solution conditioning loop further including means for modifying the temperature of said withdrawn solution.

4. The system of claim 3 wherein said first filtering means comprises a polypropylene cartridge type filter.

5. The system of claim 2 wherein said first means comprises:
   means for skimming the surface of said solution to remove said surface impurities.

6. The system of claim 5 further comprising: said surface skimming means being connected to said pump in said conditioning loop so that said skimmed solution also passes through said first filtering means.

7. The system of claim 2 wherein said first means comprises:
   a solution filtration loop associated with each said tank, each said solution filtration loop including a conduit network for withdrawing solution above a desired level from and for returning fresh solution to each said associated tank, a pump for circulating said solution through said conduit network and a second filtering means for removing said surface impurities from said withdrawn solution.

8. The system of claim 7 further comprising:
said solution filtration loop being separate from said solution conditioning loop and further including means for replenishing said withdrawn solution.

9. The system of claim 8 further comprising:
said replenishing means comprising an off-line solution preparation tank having inlet means for receiving said withdrawn solution and for adding replenishment materials to said withdrawn solution.

10. The system of claim 9 further comprising:
said off-line tank containing means for aiding filtration of said solution.

11. The system of claim 7 further comprising:
means for improving the laminate adhesion of said metal or metal alloy foil;
said laminate adhesion improving means including a plurality of treatment tanks through which said foil passes; and
said laminate adhesion improving means further including means for electrodepositing a plurality of dendritic structures on and bonding said dendritic structures to at least one surface of said foil.

12. The system of claim 11 wherein said electrodeposition means comprises:
a first one of said treatment tanks containing a mineral acid solution having a concentration of metal values to be deposited onto said foil as said dendritic structures;
said foil being at least partially immersed in said mineral acid solution; and
means for applying a cathodic current to said foil to form said dendritic structures and bond them to said at least one foil surface.

13. The system of claim 12 wherein said cathodic current applying means comprises means for applying a pulsed cathodic current to said foil.

14. The system of claim 11 further comprising:
said laminate adhesion improving means further including means for forming a fresh layer of metal on said at least one foil surface prior to forming said dendritic structures, said fresh metal layer rendering said at least one surface more uniformly electrochemically active and more receptive to said dendritic treatment.

15. The system of claim 14 wherein said fresh metal layer forming means comprises:
a mineral acid solution in a second one of said treatment tanks;
said foil being at least partially immersed in said mineral acid solution; and
means for applying a cathodic current to said foil.

16. The system of claim 14 further comprising:
said laminate adhesion improving means further including means for cleaning said foil prior to formation of said fresh metal layer.

17. The system of claim 16 wherein said cleaning means comprises:
a caustic cleaning solution in a third one of said treatment tanks, said foil being at least partially immersed in said caustic cleaning solution; and
means for applying a cathodic current to said at least partially immersed foil.

18. The system of claim 16 further comprising:
said laminate adhesion improving means further including means for applying an anti-tarnishing solution to said foil after said dendritic treatment.

19. The system of claim 18 wherein said anti-tarnishing solution applying means comprises:
a chromate containing solution in a fourth one of said treatment tanks; and
said foil being passed through said chromate containing solution.

20. The system of claim 7 further comprising:
means for electrolytically forming said metal or metal alloy foil; and
said foil forming means comprising an electrochemical solution containing a concentration of metal values in a first treatment tank, at least one anode and at least one cathode at least partially immersed in said electrochemical solution, and means for applying a current to each said anode and cathode to cause said metal values in said solution to plate onto a surface of each said cathode.

21. The system of claim 20 wherein:
said at least one cathode comprises a rotating drum cathode; and
said at least one anode comprises an arcuate anode mounted in said first tank substantially concentric with the rotational axis of said rotating drum cathode.

22. The system of claim 20 further comprising:
said solution filtration loop associated with said first tank including off-line means for replenishing said metal values in said electrochemical solution.

* * * * *